United States Patent
Avouris et al.

(10) Patent No.: US 8,053,782 B2
(45) Date of Patent: Nov. 8, 2011

(54) SINGLE AND FEW-LAYER GRAPHENE BASED PHOTODETECTING DEVICES

(75) Inventors: Phaedon Avouris, Yorktown Heights, NY (US); Yu-Ming Lin, Yorktown Heights, NY (US); Thomas Mueller, Yorktown Heights, NY (US); Fengnian Xia, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 103 days.

(21) Appl. No.: 12/546,097

(22) Filed: Aug. 24, 2009

(65) Prior Publication Data
US 2011/0042650 A1    Feb. 24, 2011

(51) Int. Cl.
*H01L 29/15* (2006.01)
(52) U.S. Cl. .......................... 257/76; 438/194
(58) Field of Classification Search ............ 257/76, 257/E21.121; 438/194
See application file for complete search history.

(56) References Cited

U.S. PATENT DOCUMENTS

| | | | |
|---|---|---|---|
| 5,629,532 A | 5/1997 | Myrick | |
| 6,559,375 B1 | 5/2003 | Meissner et al. | |
| 6,833,980 B1* | 12/2004 | Tsukagoshi et al. | 360/324 |
| 2007/0187694 A1* | 8/2007 | Pfeiffer | 257/76 |
| 2008/0018232 A1* | 1/2008 | Zhang et al. | 313/498 |
| 2009/0020764 A1* | 1/2009 | Anderson et al. | 257/77 |
| 2009/0071533 A1 | 3/2009 | Choi et al. | |
| 2009/0174435 A1* | 7/2009 | Stan et al. | 326/112 |
| 2010/0025662 A1* | 2/2010 | Cho et al. | 257/40 |
| 2010/0132771 A1* | 6/2010 | Lu | 136/252 |
| 2010/0177383 A1* | 7/2010 | Kamada et al. | 359/485 |
| 2010/0206362 A1* | 8/2010 | Flood | 136/252 |

OTHER PUBLICATIONS

V. Ryzhii, et al., Graphene Bilayer Field-Effect . . . Detection, Computational Nanoelectronics Lab, University of Aizu, http://arxiv.org/PS_cache/arxiv/pdf/0901/0901.3409v1.
Yu-Ming Lin, et al., "Operation of Graphene Transistors at Gigahertz Frequenciens", Nano Lett., 2009, 9 (1), 422-426. Dec. 19, 2008.

* cited by examiner

*Primary Examiner* — Fernando L Toledo
(74) *Attorney, Agent, or Firm* — Vazken Alexanian

(57) ABSTRACT

A photodetector which uses single or multi-layer graphene as the photon detecting layer is disclosed. Multiple embodiments are disclosed with different configurations of electrodes. In addition, a photodetector array comprising multiple photodetecting elements is disclosed for applications such as imaging and monitoring.

20 Claims, 6 Drawing Sheets

SINGLE AND FEW-LAYER GRAPHENE BASED PHOTODETECTING DEVICES

FIELD OF THE INVENTION

The present invention is a photodetector which uses single or multi-layer graphene as the photon detecting layer.

BACKGROUND

Photodetectors are used to detect or sense light or other electromagnetic energy. Currently available photodetectors are generally used in a variety of practical applications such as wired and wireless communications, sensing, monitoring, scientific instrumentations, national security, and so on.

Many optical photodetectors use semiconductor materials as the photodetection material system. Semiconductor materials, however, have a band gap, and therefore only photons having energy greater than the band gap can be detected, potentially leaving photons undetected. In addition, the intrinsic bandwidth of semiconductor based photodetectors is limited by the carrier transit time in the photodetection region. Both of these limitations results in a less than optimal photodetector.

BRIEF SUMMARY

The present invention provides a photodetecting device in which single or multiple layers of graphene are the photoconducting layer.

According to one aspect of the invention, a substrate is provided upon which a gate oxide layer deposited. A channel layer of graphene is then deposited on the gate oxide layer and source and drain contact regions are patterned on the graphene layer.

According to another aspect, split gates may be provided on top of the source and drain regions. Also, multiple source and drain regions can be provided.

According to another aspect, multiple photodetection elements can be provided along with conventional signal processing readout circuitry to create a photodetecting array.

DETAILED DESCRIPTION

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. Conventional processes well known in semiconductor processing can be utilized in fabricating the structures described herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

The present invention is the use of single or multi-layer graphene as the photodetecting layer in a photodetector. Because of graphene's unique property of being a zero or very small band gap material, photons at any wavelength (or any energy level) can be absorbed. Hence, graphene can be used as a universal material for a wide range of photonic applications at wavelengths ranging at least from ultraviolet to far-infrared. The carrier transport velocity in graphene under high E-field can approach Fermi velocity $10^6$ meter/second, which is 10 to 100 times larger than the carrier transport velocity in conventional semiconductors. This can lead to photodetectors with much higher bandwidth. Devices made with the invention can work without direct external biases between the photocurrent generation paths, which naturally leads to zero dark current and may enable many applications in imaging, remote sensing and monitoring where low dark current is essential. Devices made with the invention can also work with direct external biases between the photocurrent generation path, which usually leads to better efficiency but with some dark current.

Figure 1:
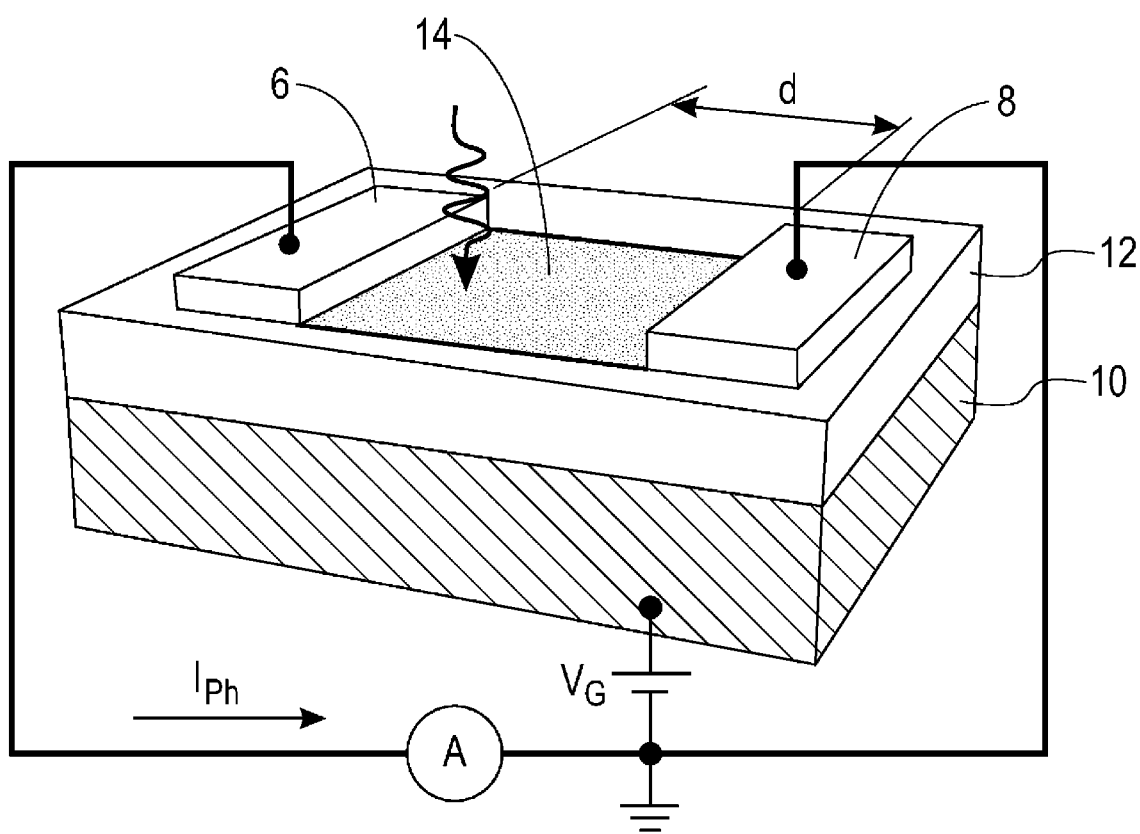
FIG. 1 shows a simple FET implementation of a graphene-based photodetector.

Referring to FIG. 1, a first embodiment of a photodetector made in accordance with this invention has a basic design similar to a conventional field effect transistor (FET) where the photodetection is realized by applying a gate bias to create a graphene p-n junction in order to maximize the detection efficiency. Backgate 10 is comprised of silicon back gate (either heavily doped or lightly doped). On top of the backgate 10, a gate oxide layer 12 is deposited as an insulating layer. Gate oxide layer can be SiO2 or any dielectric material. Drain 6 and source 8 contacts are patterned on the gate oxide layer 12. Between the drain 6 and source 8 contacts is a channel layer of graphene 14 that may be one or more layers thick. Graphene layer 14 can be doped or un-doped. The graphene layer can be created by a number of processes including mechanical exfoliation, chemical deposition, or growth.

Gate bias $V_G$ is applied to field-dope the graphene in the middle of channel layer 14. The doping of the graphene close to and underneath the source and drain is dominated by the contacts instead of the back gate. With proper selection of the gate bias VG, good detection efficiency can be obtained because a graphene p-n junction is formed at the source (or drain)—graphene interface.

Figure 2:
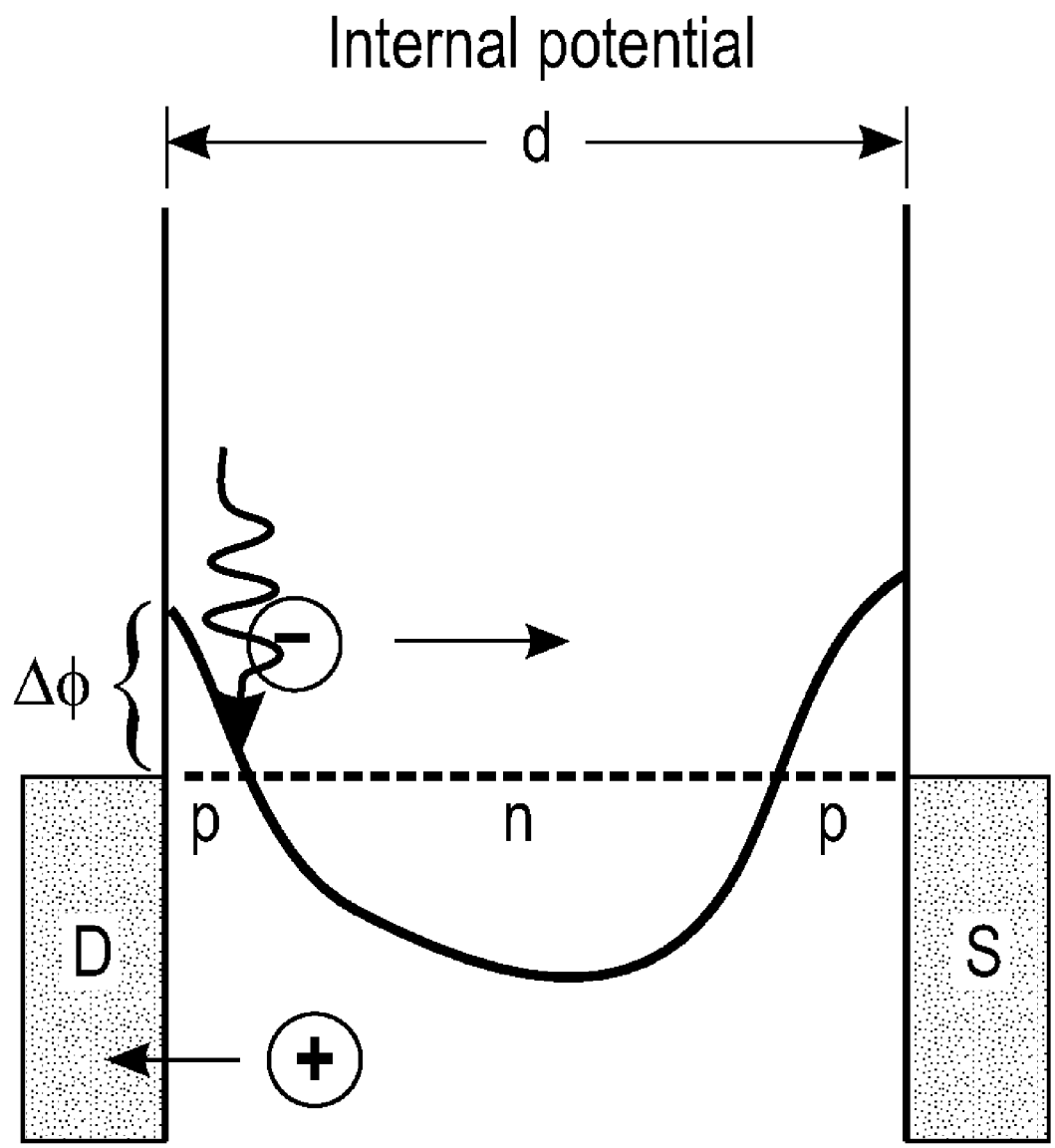
FIG. 2 is a graph showing the internal potential generated across the channel of the graphene-based photodetector.

FIG. 2 shows the internal potential generated across the width d of the channel layer 14 of FIG. 1. As can be readily seen, the areas of maximum photodetection are in close proximity to the source 8 and drain 6 regions at which a graphene p-n junction is formed and the E-field is maximized in this area, leading to effective separation of photo-generated carriers.

Figure 3:
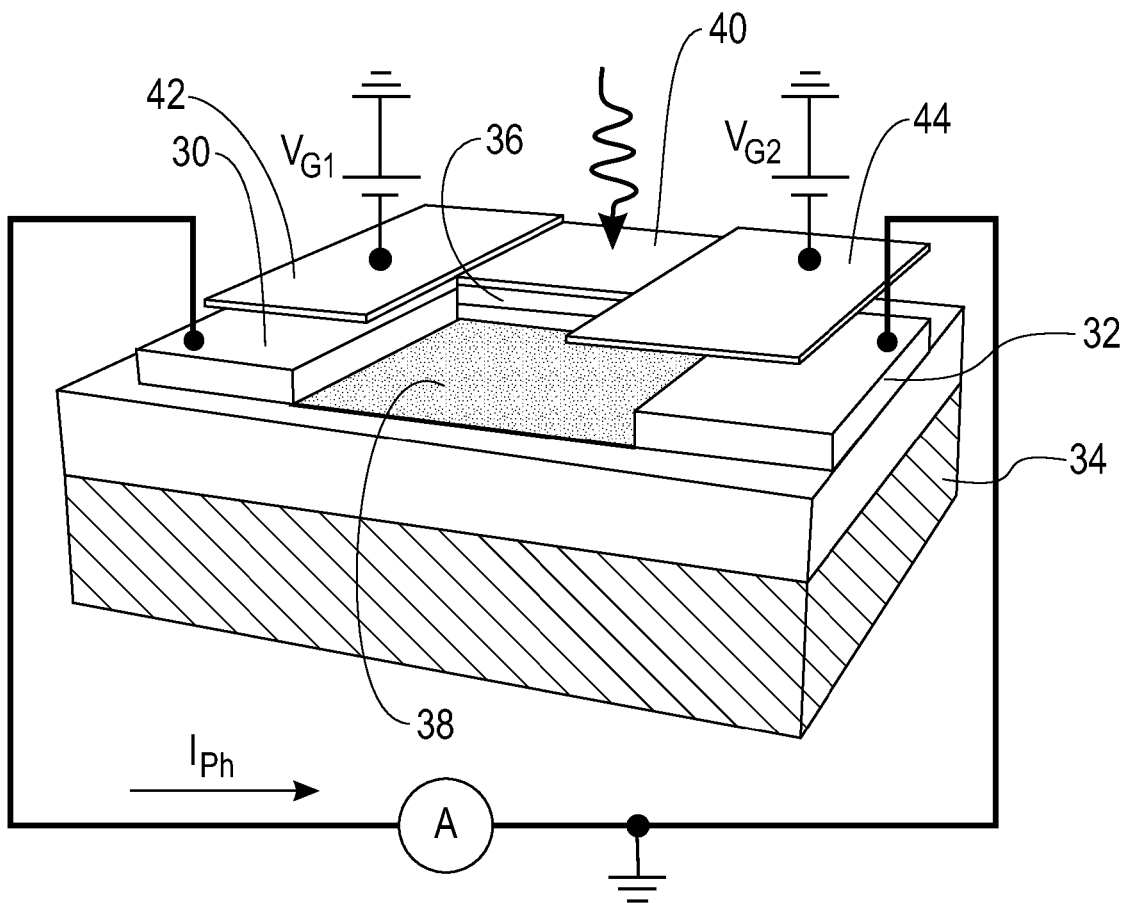
FIG. 3 shows a split-gated FET implementation of a graphene-based photodetector.

With reference to FIG. 3, another implementation of the photodetector made in accordance with the present invention uses a split gated structure so that a high e-field photodetection region can be created. Source and drain regions 30 and 32, respectively are deposited on single or few (2 to 5) layers of graphene 38. A gate dielectric layer (can be high-K or low-K) 40 is deposited on top of the graphene 38, the source 30, and drain 32 regions. Gates 42 and 44 are then patterned on top of the dielectric layer 40.

Figure 4:
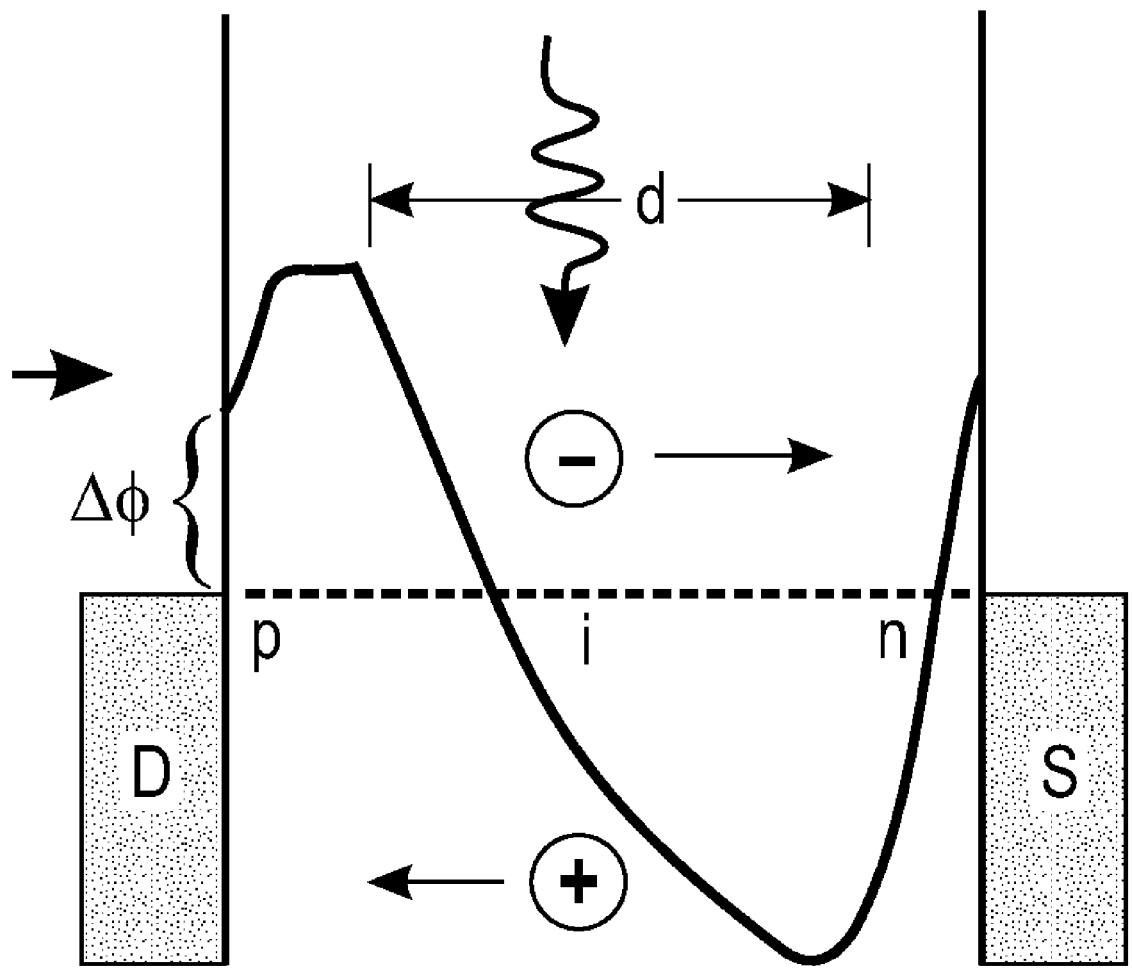
FIG. 4 is a graph showing the internal potential generated across the channel of the split-gated graphene-based photodetector.

In operation, a gate bias is applied to gates 42 and 44, respectively, to create a sensitive photo-detection region in channel 38 in which a considerable E-field is produced. The magnitude of the gate bias is a function of the thickness of the top gate dielectric 40. FIG. 4 graphically illustrates the potential generated by the top gates 42 and 44 between the source 30 and drain 32 regions of the device in FIG. 3.

Figure 5:
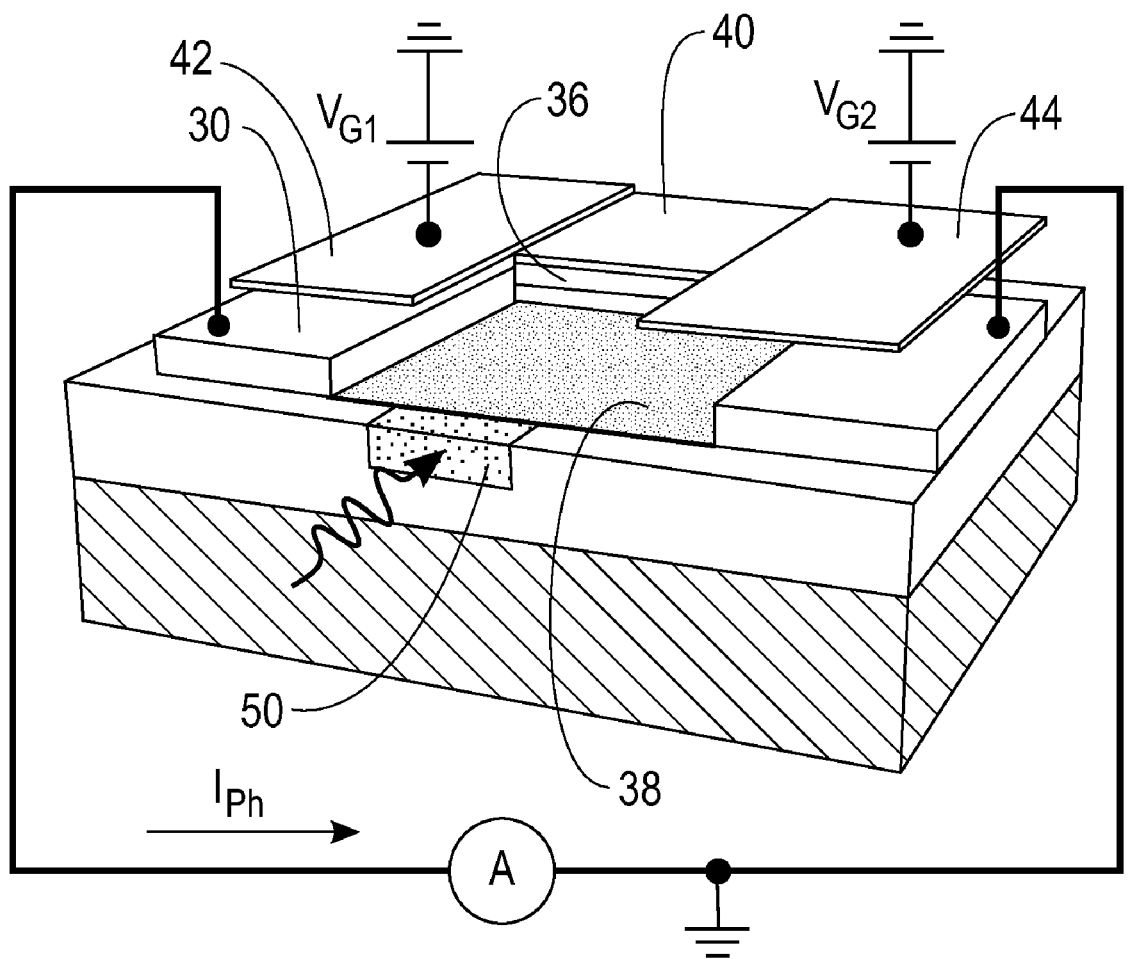
FIG. 5 shows a split-gated, graphene-based FET implementation of a graphene-based photodetector with integrated waveguide structure.

FIG. 5 shows the split gate photodetection device as seen in FIG. 3, but with the addition of an optical waveguide 50. This device operates the same way as the photodetection device of FIG. 3, but is more efficient due to the properties of the waveguide 50, which captures photons impacting the device over a larger area and channels them to the graphene layer 36. Waveguide 50 can be fabricated from silicon, silicon nitride, silicon oxy-nitride or any low-loss material, using typical semiconductor processes such as material growth, wafer bonding, wet or dry etches, and so on.

Figure 6:
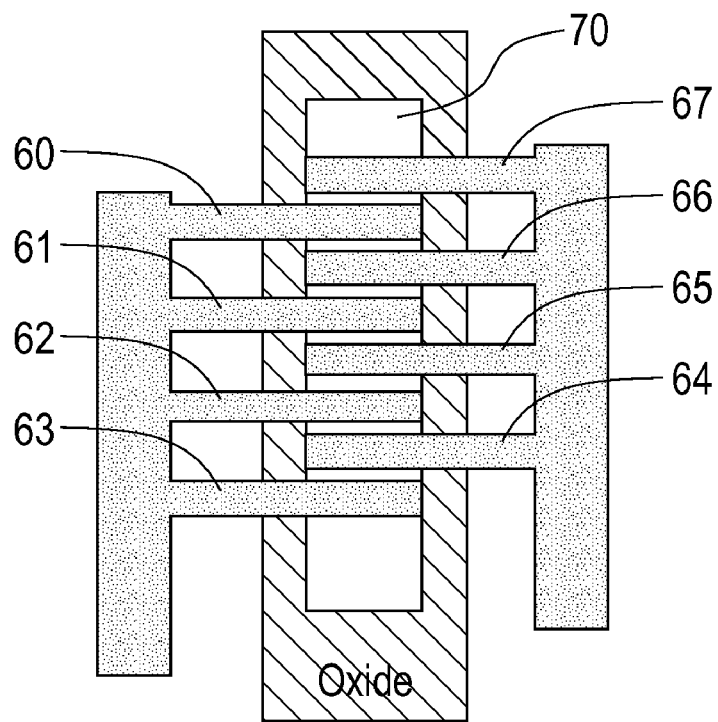
FIG. 6 shows a graphene-based photodetector with metallic interdigitated fingers for enhancing the effective photodetection area.

FIG. 6 shows another implementation of a graphene based photodetector. Interdigitated fingers 60-67 define multiple source regions and drain regions, which are patterned on top of graphene layer 70. This implementation provides for a very sensitive photodetector because the effective photo-detection area can be greatly enhanced. Different source and drain metal with different work functions can be used in order to produce an internal potential at zero source-drain bias for photo-carrier separation. Applying a source-drain bias can further enhance the photo-detection efficiency. However in this case, a dark current will be introduced into the operation. Moreover, if the same metal is used for source and drain contact, a shadow mask can be used block the light absorption in source/graphene or drain/graphene contact to enhance the photocurrent generation.

Figure 7:
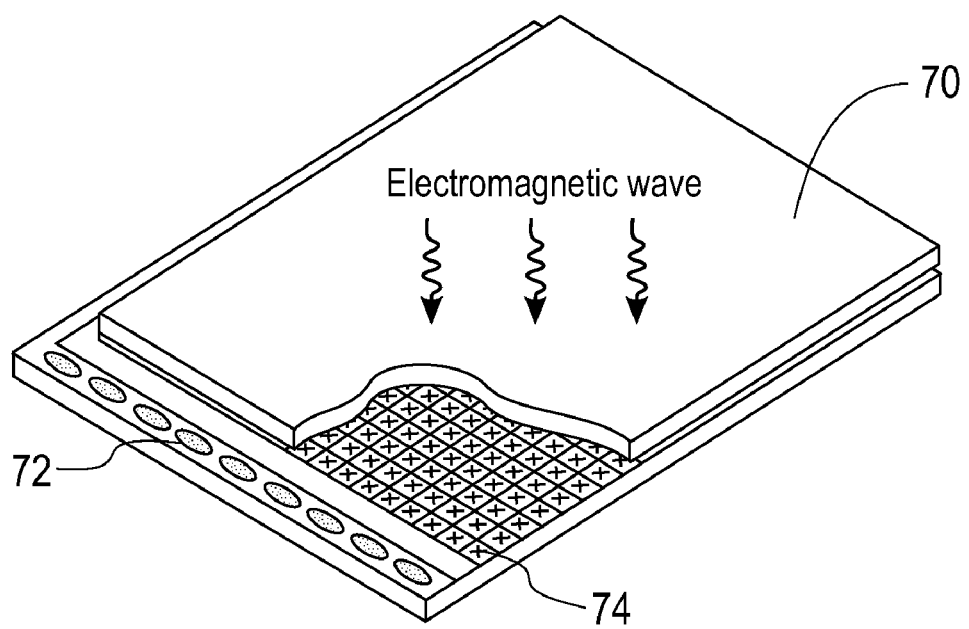
FIG. 7 shows a top view of a graphene-based photodetector array.

Photodetector arrays are very useful in applications such as imaging (in very broad wavelength range at least from far infrared to visible) and monitoring. The graphene-based photodetector of the present invention can also be fabricated in such an array 70 as shown as in FIG. 7 using standard semiconductor processes. The addition of conventional signal processing circuitry 72 can provide a readout from all of the photodetecting elements 74 in the detector array.

It is to be understood that the provided illustrative examples are by no means exhaustive of the many possible uses for my disclosure.

From the foregoing description, one skilled in the art can easily ascertain the essential characteristics of this disclosure and, without departing from the spirit and scope thereof, can make various changes and modifications of the disclosure to adapt it to various usages and conditions.

It is to be understood that the present disclosure is not limited to the embodiments described above, but encompasses any and all embodiments within the scope of the following claims:

The invention claimed is:

1. A photodetecting device comprising:
   a. a substrate;
   b. a gate oxide layer deposited on said substrate;
   c. a channel layer of graphene deposited on said gate oxide layer; and
   d. source and drain contact regions disposed on said graphene layer wherein multiple source and drain regions are provided.

2. The photodetecting device of claim 1 wherein the channel layer is a single layer of graphene.

3. The photodetecting device of claim 1 wherein the channel layer is no more than 10 layers of graphene.

4. The photodetecting device of claim 1 wherein the substrate is comprised of silicon.

5. A photodetecting device comprising:
   a. a substrate;
   b. a channel layer of graphene deposited on said substrate;
   c. source and drain contact regions disposed on said graphene layer;
   d. a gate dielectric layer deposited on said graphene layer; and
   e. split gates deposited on top of said gate dielectric layer for applying an electric field across said graphene layer.

6. The photodetecting device of claim 5 wherein the channel layer is a single layer of graphene.

7. The photodetecting device of claim 5 wherein the channel layer is no more than 10 layers of graphene.

8. The photodetecting device of claim 5 wherein the substrate is silicon.

9. A photodetecting device comprising:
   a. a substrate;
   b. an optical waveguide integral to said substrate;
   c. a channel layer of graphene deposited, on said substrate;
   d. source and drain contact regions disposed on said graphene layer;
   e. a gate dielectric layer deposited on said graphene layer; and
   f. split gates deposited on top of said gate dielectric layer.

10. The photodetecting device of claim 9 wherein the channel layer is a single layer of graphene.

11. The photodetecting device of claim 9 wherein the channel layer is no more than 10 layers of graphene.

12. The photodetecting device of claim 9 wherein the substrate is silicon.

13. The photodetecting device of claim 9 wherein the optical waveguide is a low loss material.

14. The photodetecting device of claim 9 wherein the optical waveguide is selected from the group consisting of silicon, silicon nitride, and oxynitride.

15. A photodetecting array comprised of plurality of photodetecting elements having graphene as the photodetecting layer.

16. A method for making a photodetecting device comprising:
   a. providing a substrate;
   b. depositing a gate oxide layer on said substrate;
   c. depositing a channel layer of graphene on said gate oxide layer;
   d. patterning source and drain contact regions on said graphene layer; and
   e. forming multiple source and drain regions on the contact region.

17. The method of claim 16 wherein a single layer of graphene is deposited as the channel layer.

18. The method of claim 16 wherein the channel layer is no more than 10 layers of graphene.

19. The method of claim 16 wherein the substrate is silicon.

20. The method of claim 16 further comprising:
   applying gate bias to create a graphene p-n junction.

* * * * *